(12) United States Patent
Cheung et al.

(10) Patent No.: US 7,120,814 B2
(45) Date of Patent: Oct. 10, 2006

(54) SYSTEM AND METHOD FOR ALIGNING SIGNALS IN MULTIPLE CLOCK SYSTEMS

(75) Inventors: Frank Nam Go Cheung, Agoura Hills, CA (US); Richard Chin, Torrance, CA (US)

(73) Assignee: Raytheon Company, Waltham, MA (US)

( * ) Notice: Subject to any disclaimer, the term of this patent is extended or adjusted under 35 U.S.C. 154(b) by 563 days.

(21) Appl. No.: 10/611,114

(22) Filed: Jun. 30, 2003

(65) Prior Publication Data

US 2004/0268173 A1 Dec. 30, 2004

(51) Int. Cl.
*G06F 1/12* (2006.01)
*G06F 1/04* (2006.01)

(52) U.S. Cl. .............. 713/400; 713/401; 713/500; 713/503; 375/354; 375/358; 375/359; 375/362; 370/304; 370/324; 370/350; 370/395.62

(58) Field of Classification Search .............. 713/375, 713/400, 401, 500, 503; 375/354, 358, 389, 375/362, 359; 370/304, 324, 350, 395.62
See application file for complete search history.

(56) References Cited

U.S. PATENT DOCUMENTS

| 4,992,874 | A | * | 2/1991 | Willis et al. ............... 348/565 |
| 5,272,391 | A | * | 12/1993 | Ampe et al. ................ 327/141 |
| 5,359,366 | A | * | 10/1994 | Ubukata et al. ............ 348/536 |
| 5,487,092 | A | * | 1/1996 | Finney et al. ............... 375/354 |
| 5,600,379 | A | * | 2/1997 | Wagner ....................... 348/497 |
| 5,731,843 | A | * | 3/1998 | Cappels, Sr. ................ 348/537 |
| 5,805,233 | A | * | 9/1998 | West ........................... 348/537 |
| 5,825,431 | A | * | 10/1998 | Walker ........................ 348/536 |
| 6,288,699 | B1 | * | 9/2001 | Kubota et al. ................. 345/99 |
| 6,313,676 | B1 | | 11/2001 | Abe et al. |
| 6,373,289 | B1 | | 4/2002 | Martin et al. |
| 6,522,365 | B1 | * | 2/2003 | Levantovsky et al. ...... 348/537 |
| 6,744,472 | B1 | * | 6/2004 | MacInnis et al. ........... 348/441 |
| 6,920,358 | B1 | * | 7/2005 | Greenberg et al. ........... 607/54 |
| 6,943,844 | B1 | * | 9/2005 | Cahill, III ................... 348/537 |

* cited by examiner

*Primary Examiner*—Lynne H. Browne
*Assistant Examiner*—Nitin C. Patel
(74) *Attorney, Agent, or Firm*—Leonard A. Alkov, Esq.; Karl A. Vick, Esq.

(57) ABSTRACT

A system and method for aligning an input signal (24) synchronized to a first clock signal (22) with a second clock signal (26). The invention includes a mechanism (106) for generating a third clock signal (354) and an arrangement (352) for loading the input signal (24) in accordance with the third clock signal (354) and reading out an output signal in accordance with the second clock signal (26). In an illustrative embodiment, the invention is used in a sensor system (350) to align detector input data (24), which is synchronized to a data-capture clock (22), with a signal-processing clock (26). The register (352) acts as a data path transitioning stage between the actual time the input data is sampled and the time a processing system (102) clocks in the sampled data.

20 Claims, 8 Drawing Sheets

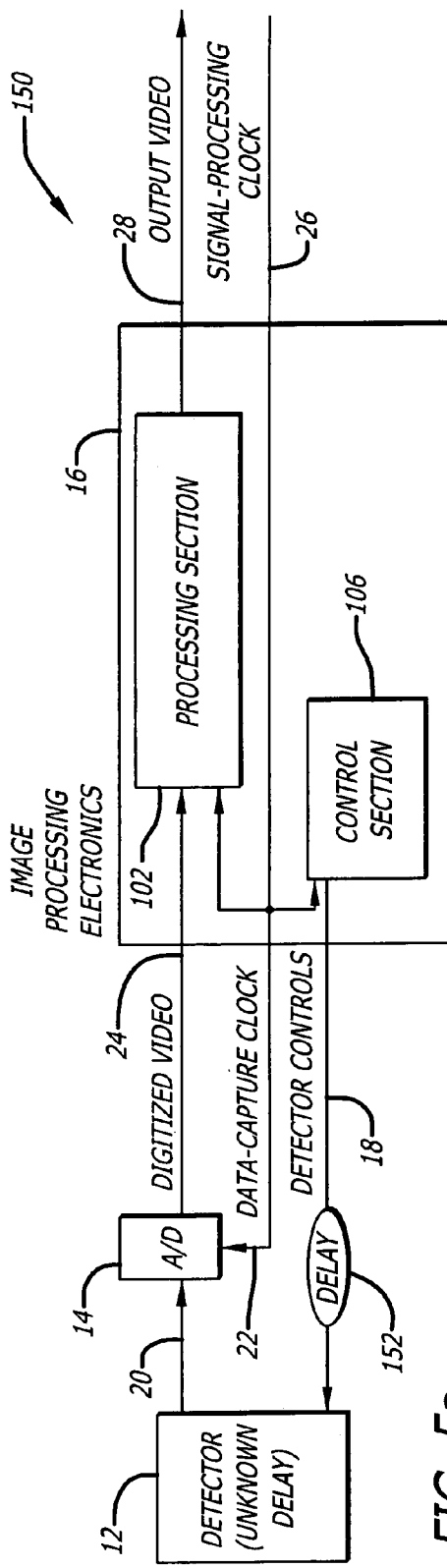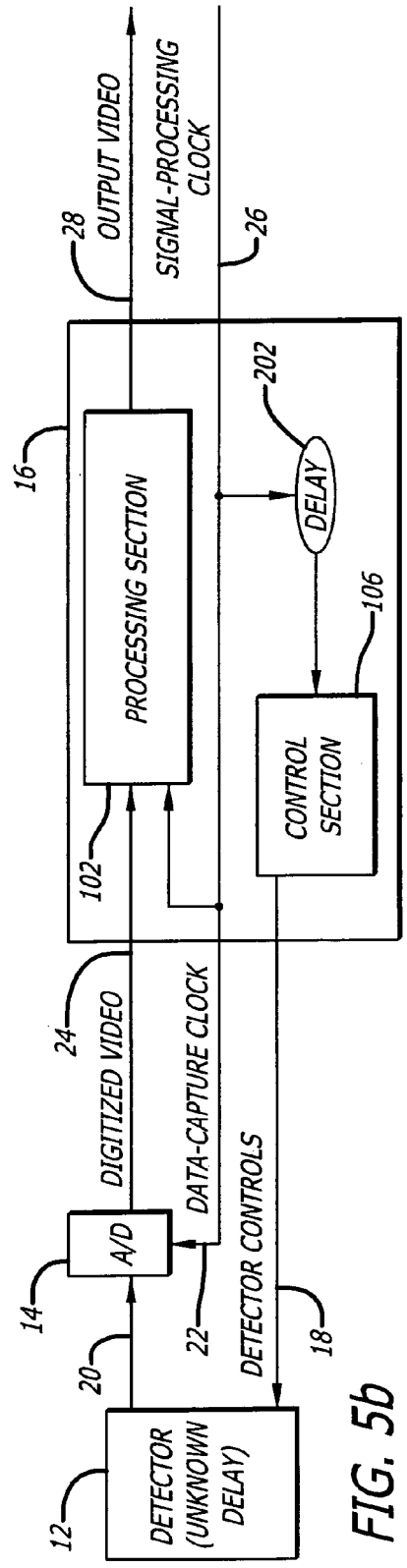
FIG. 5a (Prior Art)
FIG. 5b (Prior Art)

FIG. 7 (Prior Art) DATA EXCHANGE AND COMMUNICATION AMONG CONTROL AND PROCESSING SECTIONS DEPEND ON CLOCK PHASING AMONG SIGNAL-PROCESSING CLOCK, DATA-CAPTURE CLOCK (A) AND DATA-CAPTURE CLOCK (B).

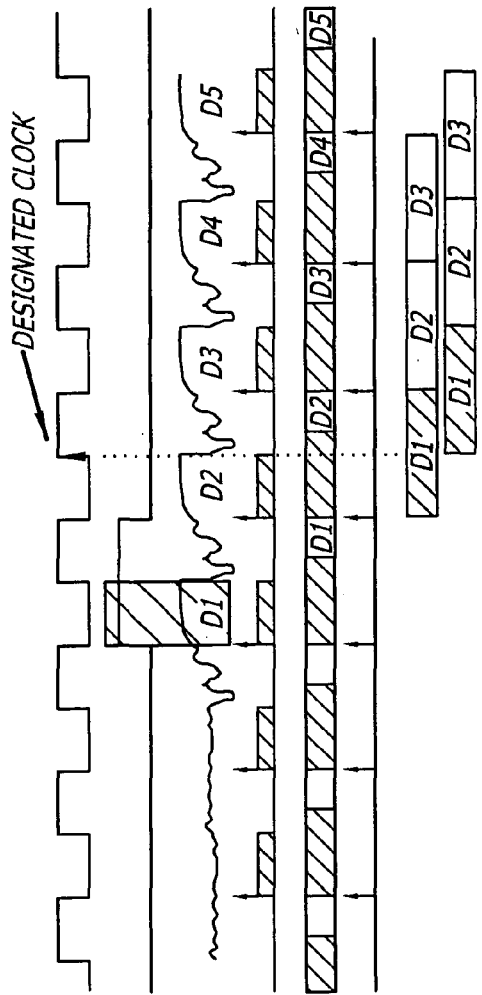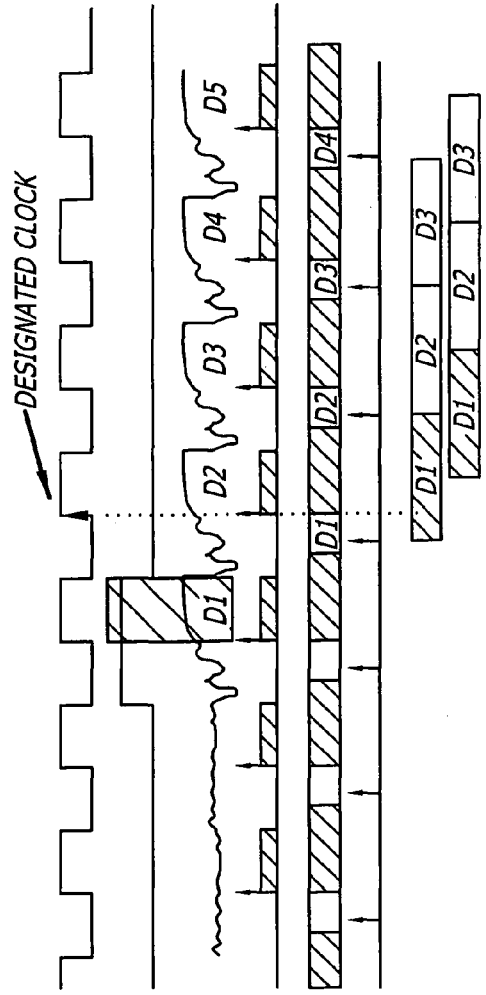

SYSTEM AND METHOD FOR ALIGNING SIGNALS IN MULTIPLE CLOCK SYSTEMS

BACKGROUND OF THE INVENTION

1. Field of the Invention

The present invention relates to electronic circuits and systems. More specifically, the present invention relates to electronic sensor systems.

2. Description of the Related Art

For systems having unknown delay variables in the control and/or data paths, data-capture clocks are often used to compensate for the variable delays. For instance, in a video imaging system having a detector and a signal processor, the signal coming into the processor from the detector may not be aligned with the system clock of the processor. A data-capture clock, which is typically a phase shifted version of the signal-processing clock, is used to capture the detector data at its optimum sampling time. However, this can result in data path uncertainty if the sampling edge of the data-capture clock causes the captured data to change during the setup and hold time region of the signal-processing clock. The relative position of the data-capture clock also causes undesirable timing shifts to the signal processing module. These shortcomings limit the adjustment range of the data-capture clock, which, for some applications (especially high speed applications), is critical to the system.

Moreover, signal processing modules in a digital system are often synchronized to a common system clock. This implies that the optimum data-sampling time of all data entry paths all must fall within a certain region of the signal-processing clock. Costly custom tailored add-ons (i.e. delay lines) for an individual system may be needed to guarantee this timing condition.

One prior art solution to these data path uncertainty and timing shift issues includes separating the signal processing module into control and processing sections each running its own tailored timing. This assumes that there cannot be much correlation between the two sections within the module because of possible clock alignment in the forbidden zone. For multi-module systems, it is hard to pass data among different sections because the processing sections in each module may have a different clock phase.

A second prior art solution delays the detector controls to align the detector video with the signal-processing clock. This approach requires expensive, power hungry, and space consuming variable delay lines to obtain the desired delay adjustment resolution.

Another solution includes adding an intermediate data buffer stage to allow independent access to the data at pixel level timing. This requires large memory buffers, and the signal processing may not start at a dedicated clock cycle due to clock phasing issues. For systems having multiple parallel signal processing modules, signal processing can only begin when all the buffers are not empty because the clock phasing may not be the same for all modules.

Another prior art approach involves supplying the detector with fixed controls and having the detector electronics provide the data clock associated with its outputs. Sections in the signal processing module must run its own tailored timing. Data exchanges and communications among sections may be difficult, especially for multi-module systems, due to clock phasing issues.

Hence, there is a need in the art for an improved system or method for aligning an input data signal with the system clock of a signal processor, which overcomes the shortcomings of prior systems.

SUMMARY OF THE INVENTION

The need in the art is addressed by the system and method; for aligning an input signal synchronized to a first clock with a second clock of the present invention. The novel invention includes a mechanism for generating a third clock signal and a circuit adapted to load the input signal in accordance with the third clock signal and read out an output signal in accordance with the second clock. In an illustrative embodiment, the invention is used in a sensor system to align detector input data, which is synchronized to a data-capture clock, with a signal-processing clock. The register acts as a data path transitioning stage between the actual time the input data is sampled and the time a processing system clocks in the sampled data.

BRIEF DESCRIPTION OF THE DRAWINGS

FIG. 3b is a timing diagram for the system of FIG. 3a.

FIGS. 5a and 5b are simplified block diagrams of video systems using a second prior art approach.

FIG. 7 is a simplified block diagram of a video system using a fourth prior art approach.

FIGS. 9a and 9b are timing diagrams for the system of FIG. 8, illustrating the timing for two sample cases.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1A:
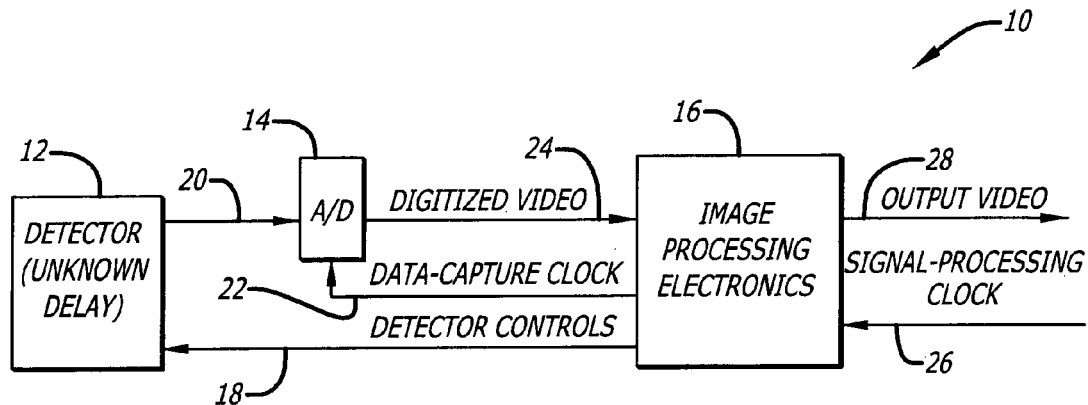
FIG. 1a is a system block diagram showing the key components of a typical video system.

FIG. 1a is a system block diagram showing the key components of a typical video system 10, including a detector 12, an analog-to-digital converter (A/D) 14, and image processing electronics 16. The image processor 16 sends control signals 18 to the detector 12, which then outputs a detector signal 20 after an unknown delay. The detector response 20 is captured and digitized by the A/D 14, which is synchronized to a data-capture clock 22. The digitized data 24 is then processed by the image processing electronics 16, which is synchronized to a signal-processing clock 26 and outputs an output signal 28.

Figure 1B:
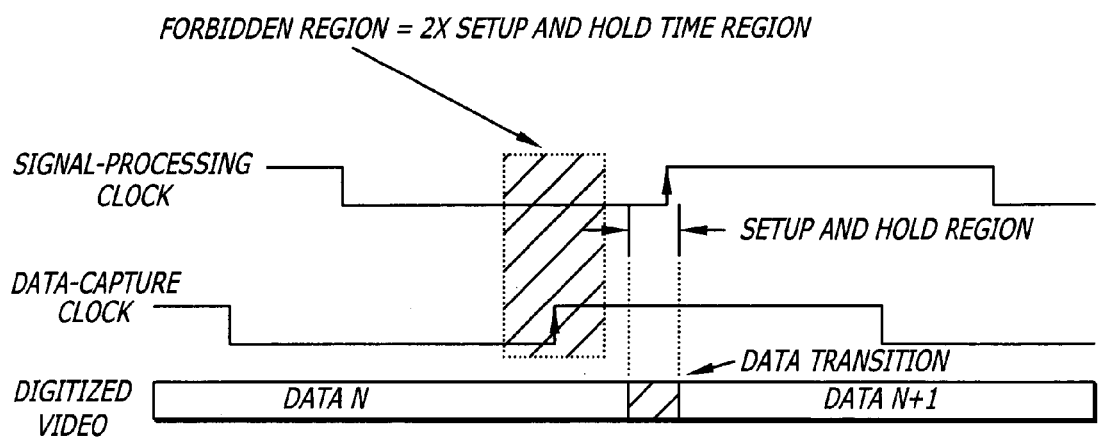
FIG. 1b is a timing diagram for the system of FIG. 1a, illustrating a timing problem which can occur with this system.

The data-capture clock 22 is used to compensate for the unknown system delays and to capture the detector data at the optimum time. It is usually a phase shifted version of the signal-processing clock 26. If the sampling edge of the data-capture clock 22 is within the forbidden vicinity of the signal-processing clock 26, the captured A/D data 24 will change at the setup and hold time region of the signal-processing clock 26. This causes the A/D data 24 to be erratically captured by the image processing electronics 16 and hence, produces erratic outputs. FIG. 1b is a timing diagram for the system of FIG. 1a, illustrating this problem.

Figure 2A:
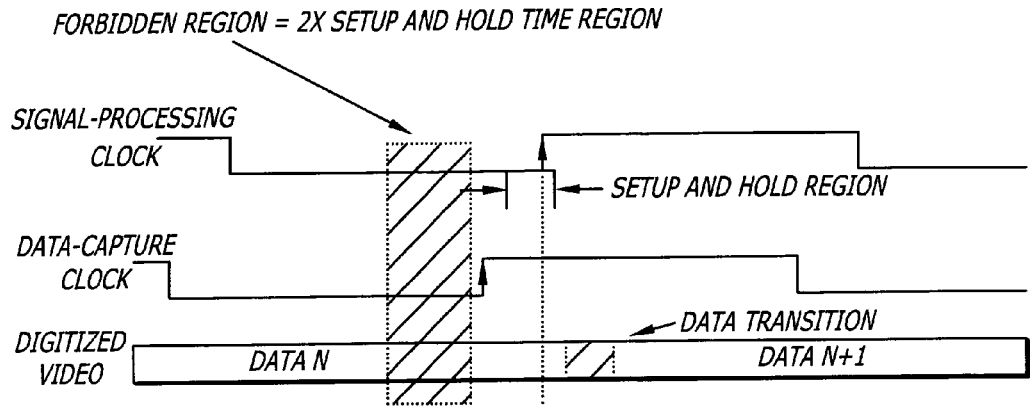
FIGS. 2a and 2b are timing diagrams for the system of FIG. 1a, illustrating the timing shift problem that occurs with this system.
Figure 2B:
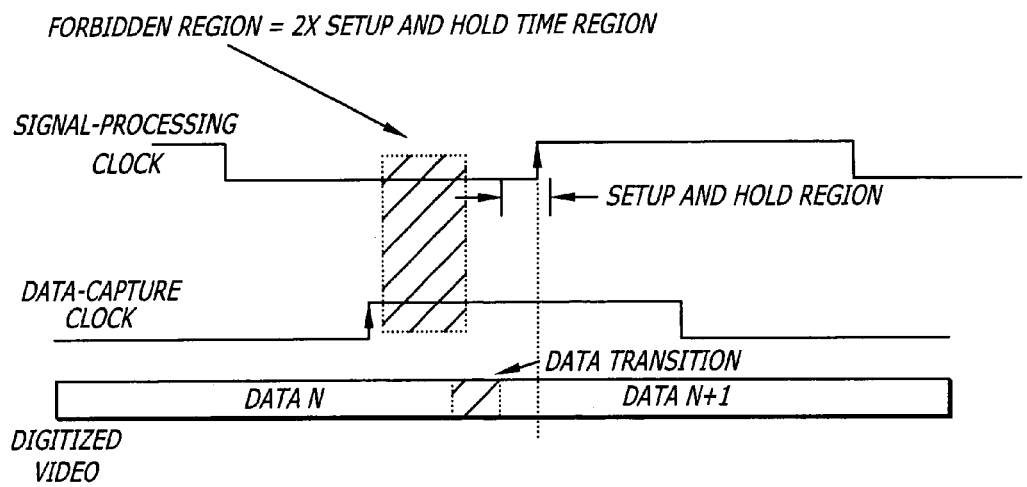

Moreover, the position of the data-capture clock 22 causes undesirable timing shifts to the image processing electronics 16. FIGS. 2a and 2b are timing diagrams for the system of FIG. 1a, illustrating the time shift problem. For a fixed signal-processing clock 26, the image processing electronics 16 captures Data N or Data N+1 depending on whether the data-capture clock 22 lands to the right (as shown in FIG. 2a) or to the left (shown in FIG. 2b), respectively, of the forbidden region. These limitations limit the adjustment range of the data-capture clock 22, and for some applications (especially high speed applications), this is critical to the system.

Furthermore, for systems with multiple input sources, costly custom tailored add-ons (i.e. delay lines) for each individual input source may be needed to ensure that the data-capture clocks for all the input sources are kept away from the forbidden timing region, and are all landed on the same side of the forbidden region to avoid undesirable timing effects.

Figure 3A:
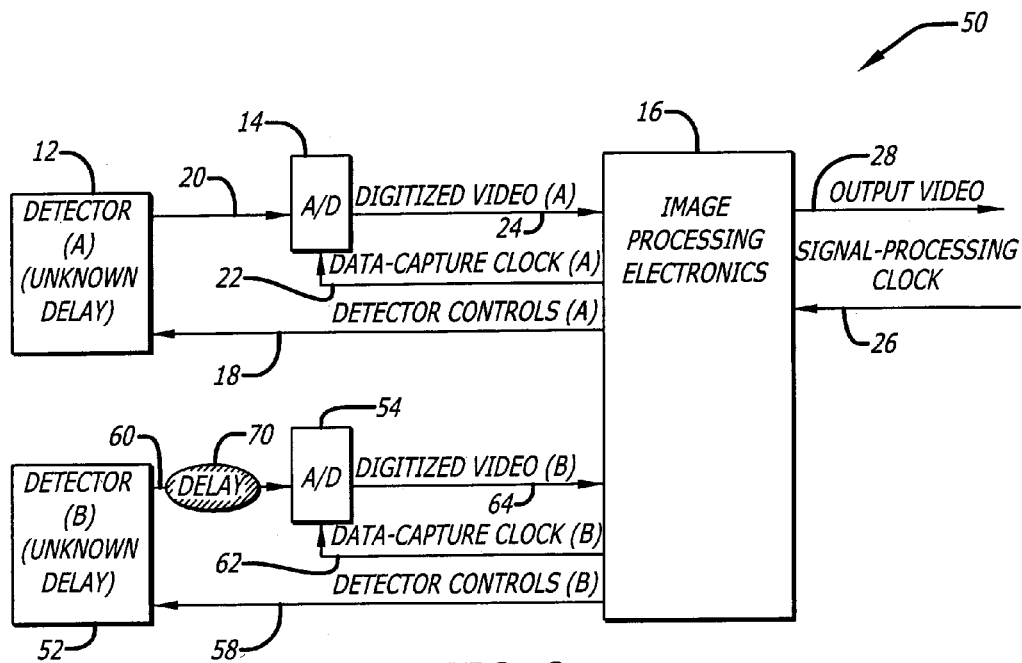
FIG. 3a is a simplified block diagram of a conventional video system with multiple inputs.

FIG. 3a is a simplified block diagram of a conventional video system 50 with multiple inputs. The system 50 includes a second detector 52 (labeled detector B) and A/D 54 in addition to the system of FIG. 1a (which includes a first detector 12 that is labeled detector A). The image processor 16 sends a second control signal 58 to the second detector 52, which then outputs a second detector signal 60. The second detector response 60 is captured and digitized by the A/D 54 using a second data-capture clock 62. The digitized data 64 is then processed by the image processing electronics 16. A delay 70 is added between the detector output 60 and the A/D 54 to ensure that the second data-capture clock 62 lands on the same side of the forbidden region as the first data-capture clock 22.

Figure 3B:
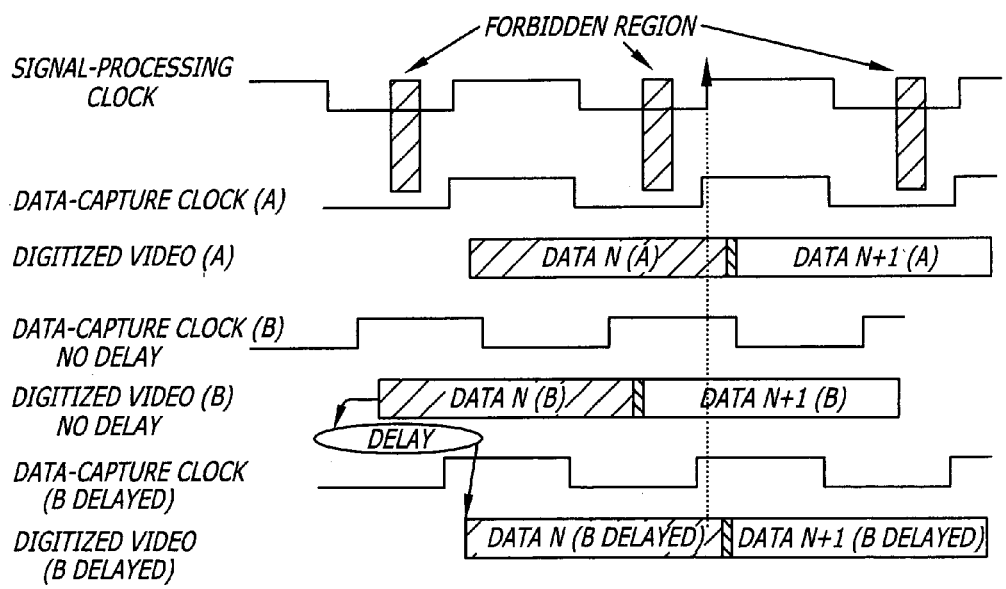

FIG. 3b is a timing diagram for the system of FIG. 3a, illustrating the undesired timing effect that can occur with or without delay 70. In the example shown, the first data-capture clock 22 lands to the right of the forbidden region and the processor 16 receives Data. N from the first detector 12. Without a delay 70, the second data-capture clock 62 lands to the left of the forbidden region, so the processor 16 receives Data N+1 from the second detector 52 during the same clock cycle. By adding a delay 70 to the second detector output 60, the second data-capture clock 62 is shifted so that it also lands to the right of the forbidden region, and the processor 16 also receives Data N from the second detector 52. Delay lines, however, are expensive, power hungry, and space consuming.

Prior attempts to solve this problem can be classified into four categories: 1) separating the signal processing module into control and processing sections, each running its own tailored timing; 2) delaying the detector controls to align the detector video with the signal-processing clock; 3) adding an intermediate data buffer stage to allow independent access to the data at pixel level timing; and 4) having the detector electronics provide the necessary signal-processing clock for the system.

Figure 4:
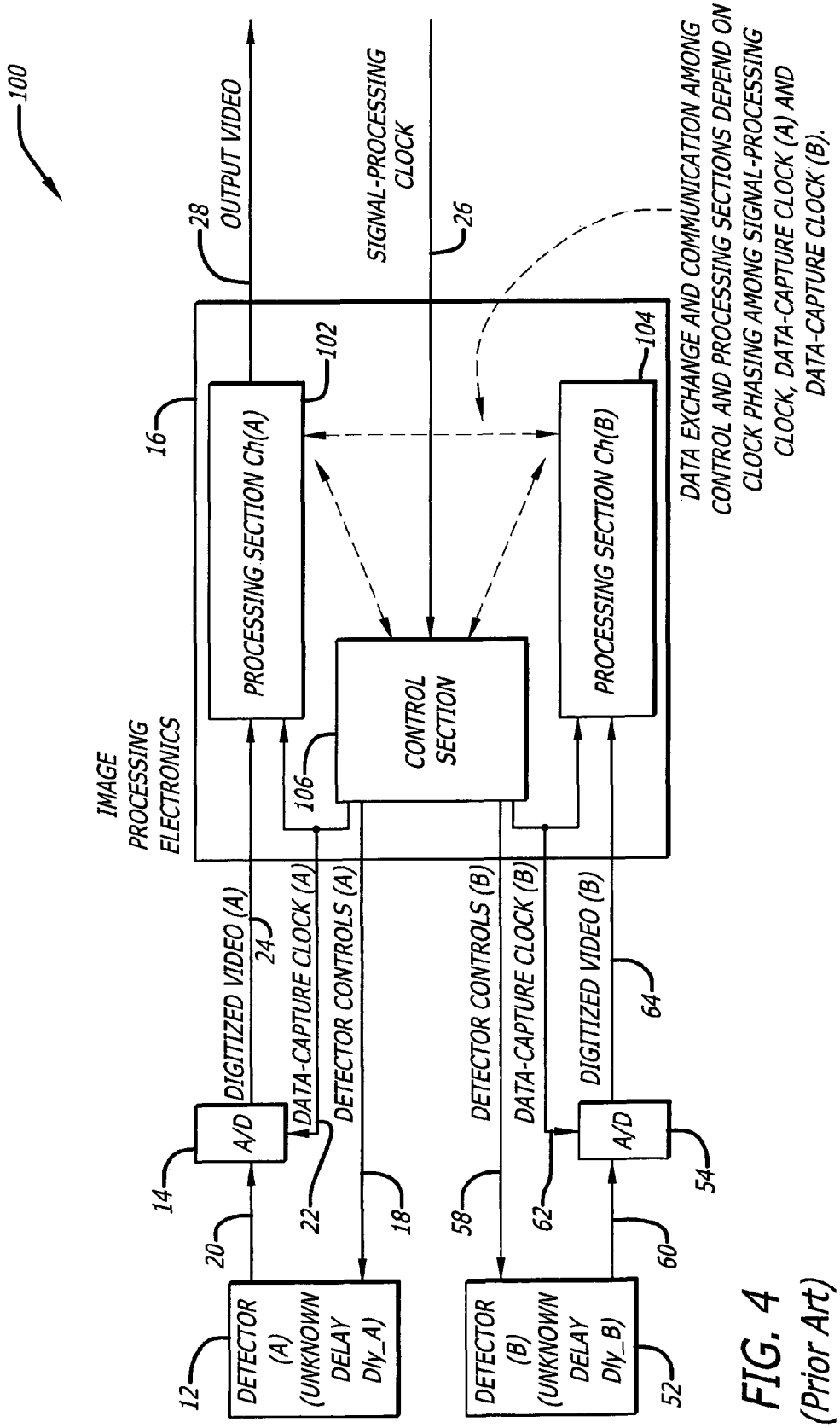
FIG. 4 is a simplified block diagram of a video system using a first prior art approach.

FIG. 4 is a simplified block diagram of a video system 100 using the first prior art approach. The example system 100 includes two detectors 12 and 52, whose outputs 20 and 60 are digitized by A/D's 14 and 54, which are synchronized to data-capture clocks 22 and 62, respectively. The digitized data 24 and 64 is then sent to the image processing electronics 16. The image processing electronics 16 is separated into processing sections 102 and 104, and a control section 106. The first processing section 102 processes the digitized video 24 from the first detector 12. The second processing section 104 processes the digitized video 64 from the second detector 52. The control section 106 is run on the signal-processing clock 26, and generates control signals 18 and 58 for the detectors 12 and 52. The processing sections 102 and 104 are run on the data-capture clocks 22 and 62, which may be phase shifted versions of the signal-processing clock 26 generated by the control section 106. This assumes that there cannot be much correlation between the processing and control sections within the module because of possible clock alignment in the forbidden zone. For a multi-module system, it is hard to pass data or controls among different sections because the processing section in each module may have a different clock phase.

FIGS. 5a and 5b are simplified block diagrams of video systems using the second prior art approach. Here, the detector control path delay is varied to align the detector video to the system clock. The data-capture and signal-processing clocks are the same in this case. Two methods were previously used: one was to delay all the detector control signals (as shown in FIG. 5a), and the other was to generate a delayed control section clock to delay the controls to detector (as shown in FIG. 5b).

The system 150 of FIG. 5a includes a detector 12, whose output is digitized by an A/D 14 and then processed by image processing electronics 16. The control section 106 of the image processor 16 sends control signals 18 to the detector 12. The processing 102 and control 106 sections of the image processing electronics 16 and the A/D 14 are all run on the same signal-processing clock 26. (The data-capture clock 22 is the same as the signal-processing clock 26.) A delay 152 is added between the control section 106 and the detector 12 to delay the control signals 18 such that the detector output 20 is aligned with the signal-processing clock 26. In the system 200 of FIG. 5b, this delay is achieved by adding a delay 202 between the signal-processing clock 26 and the control section 106. Either way, this approach requires expensive, power hungry, space consuming variable delay lines or delay circuits to obtain the desired delay adjustment resolution.

Figure 6:
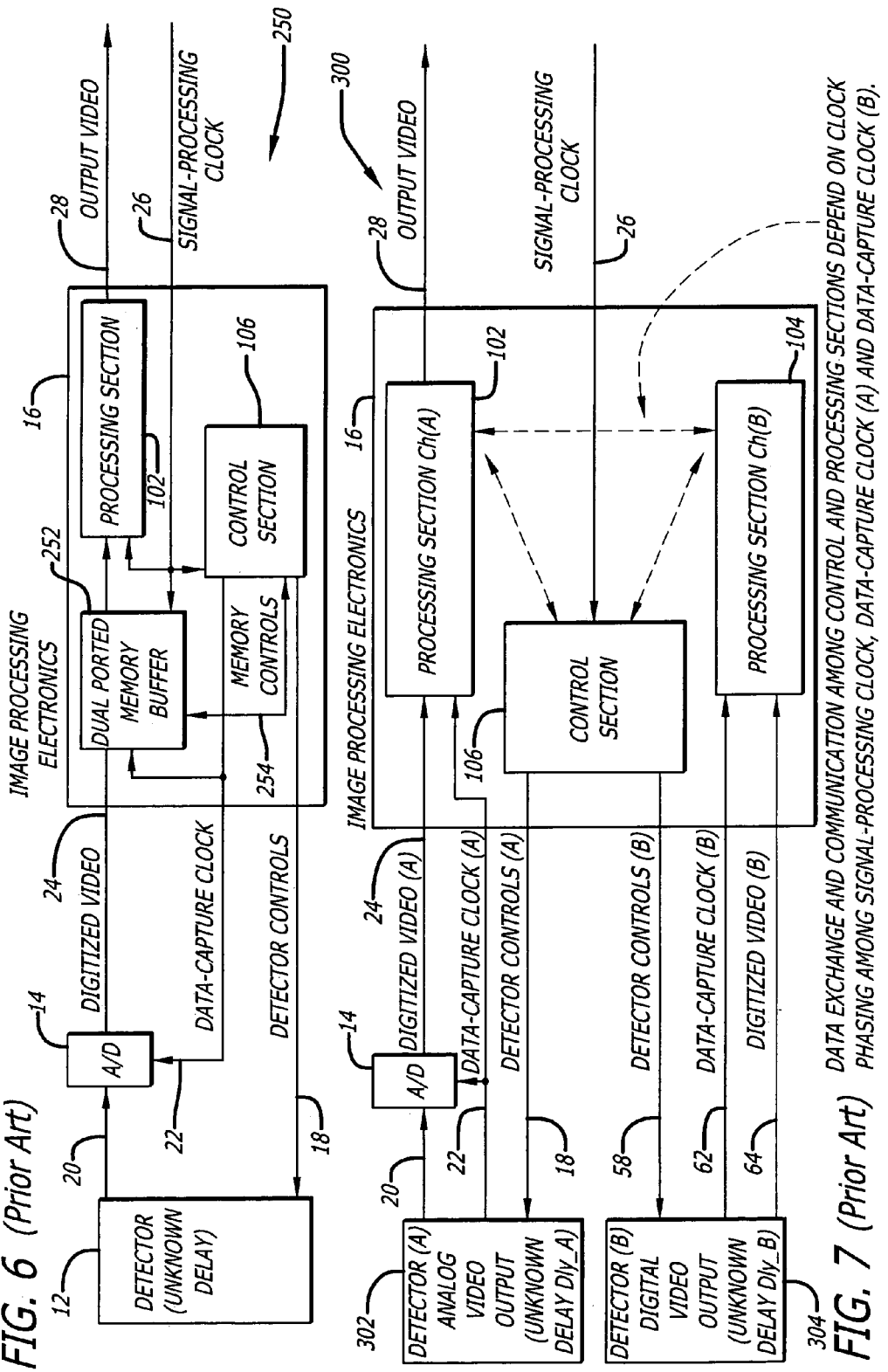
FIG. 6 is a simplified block diagram of a video system using a third prior art approach.

FIG. 6 is a simplified block diagram of a video system 250 using the third prior art approach: adding an intermediate data buffer stage to allow independent access to the data at pixel level timing. The system 250 includes a detector 12, whose output is digitized by an A/D 14 and then processed by image processing electronics 16. The image processing electronics 16 includes a dual ported memory buffer 252, in addition to a processing section 102 and control section 106, which are run on a signal-processing clock 26. The control section 106 generates detector controls 18 and memory controls 254, and a data-capture clock 22. The A/D 14 samples the detector data 20 and stores it in the memory buffer 252 in accordance with the data-capture clock 22. The data is then read out from the buffer, when the buffer is not empty, to the processing section 102 in accordance with the signal-processing clock 26.

With this approach, when the phase relationship between the data-capture 22 and the signal-processing 26 clocks varies, the image processing electronics 16 may start at different clock cycles rather than at a fixed, designated clock cycle. For systems having multiple parallel signal processing modules, signal processing can only begin when all the buffers are not empty because the phasing between the data-capture clocks and the signal-processing clock may not be the same for all modules.

FIG. 7 is a simplified block diagram of a video system 300 using the fourth prior art approach: supplying the detector with fixed controls, and having the detector electronics provide the necessary signal-processing clock for the system. Certain types of detectors output their own clocks that are closely coupled with the detector video. Some of them even have digitized video and clock as outputs. The system 300 of FIG. 7 includes two detectors, an analog output detector 302 and a digital output detector 304. The output 20 of the analog detector 302 is digitized by an A/D 14 and input to a first processing section 102 of the image processing electronics 16. The analog detector 302 also outputs a first data-capture clock 22, which is fed to the A/D 14 and the first processing section 102. The digital output 64 of the digital detector 304 is input to a second processing section 104. The digital detector 304 also outputs a second data-capture clock 62, which is fed to the second processing section 104. The control section 106 of the image processing electronics 16, which generates the control signals 18 and 58 for the detectors 302 and 304, is run on a signal-processing clock 26.

This is very similar to case (1) described above, except the signal-processing clock is provided by the detector. The image processing electronics are divided into different sections, each having its own tailored timing. Data exchanges and communication between sections may be difficult due to clock phasing issues.

The present invention allows the sampling edge of the data-capture clock to be freely placed anywhere within the signal-processing clock period without causing any data path uncertainty or timing shift issues, without any delay line add-ons. For systems with multiple data paths, data can thus be sampled at their optimum settling time without affecting timing in the signal processing modules.

The invention adds a data path transitioning stage between the actual time the external data is sampled and the time the processing system clocks in the sampled data. The transition stage transfers the sampled data from the data-capturing clock domain to the signal-processing clock domain as a function of the phase relationship between the two clocks, and self aligns the sampled data to the designated signal-processing clock relative to the processing module timing chain. Functionally, the transitioning stage guarantees that the sampled data shows up at a designated signal-processing clock cycle independent of the phase relationship between the clocks on a per module basis.

Figure 8:
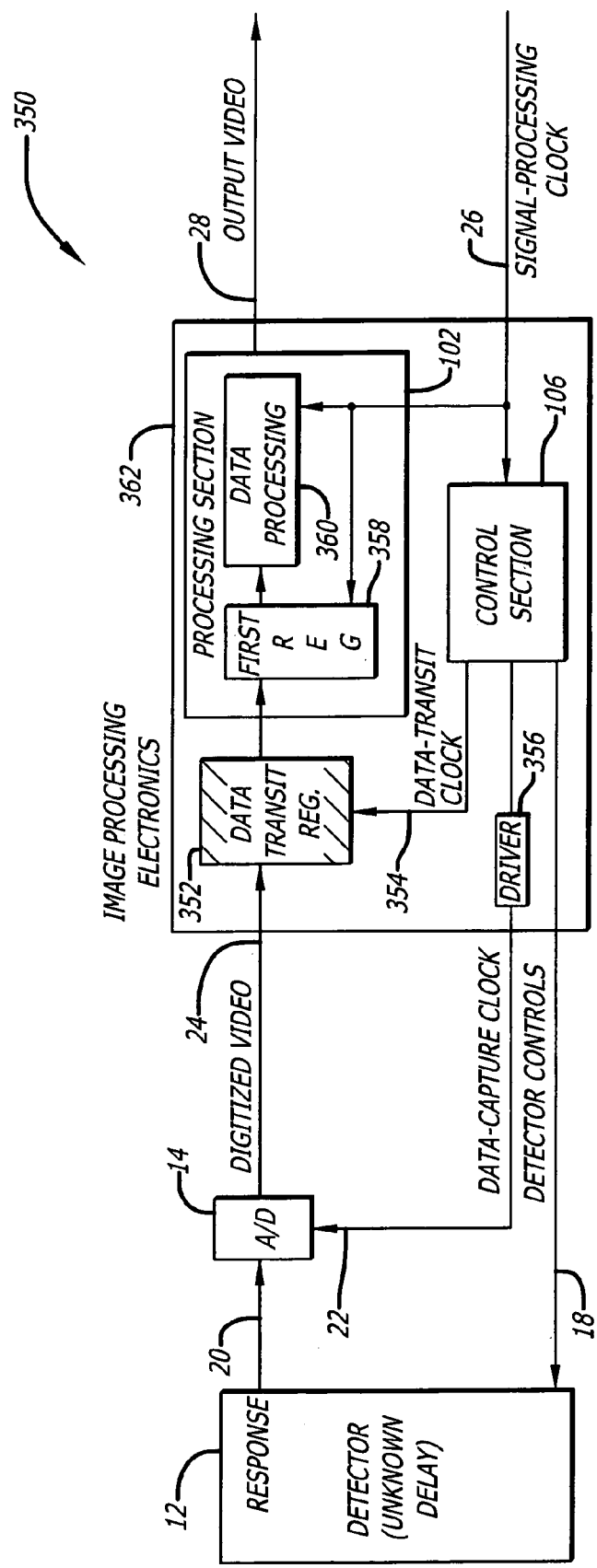
FIG. 8 is a simplified block diagram of a video imaging system designed in accordance with an illustrative embodiment of the present invention.

FIG. 8 is a simplified block diagram of a video imaging system 350 designed in accordance with an illustrative embodiment of the present invention. The system 350 includes a detector 12, an A/D 14, and image processing electronics 362. The image processing electronics 362 includes a processing section 102 and a control section 106. (In the example of FIG. 8, the processing section 102 includes a first register 358 and a data processing unit 360.) The processing section 102 and control section 106 are both run on a signal-processing clock 26. The control section 106 sends control signals 18 to the detector 12, which then outputs a detector signal 20 after an unknown delay. The detector response 20 is captured and digitized by the A/D 14, which is synchronized to a data-capture clock 22 generated by the control section 106. The digitized video 24 is input to a data transit register 352 and read out to the processing section 102, which outputs a video signal 28.

In accordance with the teachings of the present invention, a data path transitioning stage is added between the A/D 14 and the processing section 102. The transition stage is a register 352 (labeled data transit register) having its own clock 354 (data-transit clock). In the illustrative embodiment, the data-transit clock 354 is a phase shifted version of the signal-processing clock 26 generated by the control section 106. The timing of the data-transit clock 354 is designed so that it captures the digitized video 24 from the data-capture clock domain and aligns it to a designated signal-processing clock cycle, independent of the phase relationship between the data-capture 22 and signal-processing 26 clocks. A small driver 356 may be added between the control section 106 and the data-capture clock 22 to provide a sufficient delay to avoid any clock skewing problem between the data-capture clock 22 and the data-transit clock 354.

FIGS. 9a and 9b are timing diagrams for the system of FIG. 8, illustrating how the present invention handles different timing cases. A signal "first pixel indicator", synchronized to the falling edge of the signal-processing clock 26, is generated by the control section 106 to indicate when the first detector response is at pixel clock resolution. The data-capture clock 22 is then adjusted within the first pixel indicator period in a much finer resolution for the optimum sampling point. When the optimum data-capture clock position is within the first half of the first pixel indicator, the sampling edge of the data-transit clock 354 is aligned to the falling edge of the signal-processing clock (as shown in FIG. 9a). At a designated cycle of the signal-processing clock 26, the first register 358 of the processing section 102 reads data D1 from the data transit register 352.

When the optimum A/D sampling window is within the second half of the first pixel indicator, the sampling edge of the data-transit clock 354 is aligned to the middle (or further down) of the signal-processing clock low period (as shown in FIG. 9b). At the designated cycle of the signal-processing clock 26, the first register 358 reads data D1 from the data transit register 352.

Thus, the data-transit clock timing adjustment feature aligns the digitized video to a specific, designated signal-processing clock cycle for processing, independent of the phase relationship between the data-capture 22 and signal-processing 26 clocks.

This invention works for both analog or digital types of detector outputs, with or without detector generated clocks. As long as the data-capture clock points to the optimum data sampling point of detector response, the correct data will show up at the designated clock cycle, independent of system clock phasing. To handle a digital type of detector response, the A/D can be replaced by a digital register clocked by the data-capture clock. The detector generated clocks are not needed.

For a multi-module system with one system clock, external data on different data paths can be individually sampled at their optimum sampling points. Data sharing between modules is made possible after the transitioning stage because everything is synchronous in the system clock domain. For systems with multiple parallel signal processing modules, signal processing can always start at a designated clock cycle independent of the data-capture clock phasing differences in each module.

For single data path systems, this invention provides a three clock (data-capture clock, data-transit clock and signal-processing clock) solution as opposed to the one or two clock solutions previously used. It does not require external delay lines or large memory buffers. Data will always show up and synchronized to a specific, dedicated signal-processing clock cycle independent of the phase relationship between the data-capture and signal-processing clocks. This allows the system to run on fixed timing. For systems with multiple inputs, the benefits of this invention avoids many system timing issues associated with methods previously used.

While the illustrative embodiment described has been in reference to a video imaging application, the invention is not limited thereto. It may be used in other applications without departing from the scope of the present teachings.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A system for aligning an input signal synchronized to a first clock signal with a second clock signal comprising:
    first means for generating a third clock signal that is a phase shifted version of said second clock signal; and
    second means for receiving said input signal in accordance with said third clock signal and providing an output signal in accordance with said second clock signal.

2. The invention of claim 1 wherein said first clock signal is a phase shifted version of said second clock signal.

3. The invention of claim 1 wherein said third clock signal is adjusted to align said output signal to a designated cycle of said second clock signal.

4. The invention of claim 1 wherein said system further includes third means for generating a first pixel signal for indicating when the input signal is at pixel clock resolution.

5. The invention of claim 4 wherein said first pixel signal is synchronized to a falling edge of said second clock signal.

6. The invention of claim 5 wherein a sampling edge of said third clock signal is aligned to a falling edge of said second clock signal if a sampling edge of said first clock signal is within a first half of said first pixel signal.

7. The invention of claim 5 wherein a sampling edge of said third clock signal is aligned to middle or further down of a low period of said second clock signal if a sampling edge of said first clock signal is within a second half of said first pixel signal.

8. The invention of claim 1 wherein said system further includes fourth means for providing a delay to avoid any clock skewing problems between said first clock signal and said third clock signal.

9. The invention of claim 8 wherein said fourth means is a driver in a signal path of the first clock signal.

10. A method for aligning an input signal synchronized to a first clock signal with a second clock signal including the steps of:
    generating a third clock signal that is a phase shifted version of said second clock signal;
    loading said input signal into memory in accordance with said third clock signal; and
    reading said input signal from said memory in accordance with said second clock signal.

11. A system for aligning an input signal synchronized to a data-capture clock signal with a signal-processing clock signal comprising:
    a control module adapted to receive said signal-processing clock signal and generate a data-transit clock signal, which is a phase shifted version of said signal-processing clock signal;
    a first register adapted to receive said data-transit clock signal and in accordance therewith load said input signal; and
    a second register adapted to receive said signal-processing clock signal and in accordance therewith load said input signal from said first register.

12. The invention of claim 11 wherein said control module is also adapted to generate said data-capture clock signal for capturing said input signal by shifting said signal-processing clock signal in phase by an amount optimal for data capture.

13. The invention of claim 11 wherein a timing of said data-transit clock signal is such that said input signal is captured and aligned to a designated cycle of said signal-processing clock signal, independent of a phase relationship between said data-capture and signal-processing clock signals.

14. The invention of claim 11 wherein a phase shift of said data-transit clock signal relative to said signal-processing clock signal is dependent on a phase relationship between said data-capture and signal-processing clock signals.

15. The invention of claim 11 wherein said control module is also adapted to generate a first pixel signal for indicating when said input signal is at pixel clock resolution.

16. The invention of claim 15 wherein a phase shift of said data-transit clock signal relative to said signal-processing clock signal is dependent on a position of said data-capture clock signal relative to said first pixel signal.

17. The invention of claim 15 wherein said first pixel signal is synchronized to a falling edge of said signal-processing clock signal.

18. The invention of claim 17 wherein a sampling edge of said data-transit clock signal is aligned to a falling edge of said signal-processing clock signal if a sampling edge of said data-capture clock signal is within a first half of said first pixel signal.

19. The invention of claim 17 wherein a sampling edge of said data-transit clock signal is aligned to a middle or further down of a low period of said signal-processing clock signal if a sampling edge of said data-capture clock signal is within a second half of said first pixel signal.

20. The invention of claim 11 wherein said system further includes a driver adapted to provide a delay to said data-capture clock signal in order to avoid any clock skewing problems between said data-capture and data-transit clock signals.

* * * * *